United States Patent
Kishi

(10) Patent No.: US 7,268,464 B2
(45) Date of Patent: Sep. 11, 2007

(54) ULTRASONIC MOTOR

(75) Inventor: Masanori Kishi, Tokyo (JP)

(73) Assignee: Olympus Corporation, Tokyo (JP)

( * ) Notice: Subject to any disclaimer, the term of this patent is extended or adjusted under 35 U.S.C. 154(b) by 126 days.

(21) Appl. No.: 11/121,285

(22) Filed: May 3, 2005

(65) Prior Publication Data

US 2005/0253485 A1    Nov. 17, 2005

(30) Foreign Application Priority Data

May 13, 2004    (JP)    ............... 2004-144172

(51) Int. Cl.
*H01L 41/08*    (2006.01)
(52) U.S. Cl. ................................. 310/323.02
(58) Field of Classification Search ........... 310/323.02, 310/323.12, 323.16, 328
See application file for complete search history.

(56) References Cited

U.S. PATENT DOCUMENTS

| | | | | |
|---|---|---|---|---|
| 5,136,200 | A * | 8/1992 | Takizawa et al. | 310/323.16 |
| 5,191,688 | A * | 3/1993 | Takizawa et al. | 29/25.35 |
| 5,696,421 | A * | 12/1997 | Zumeris et al. | 310 |
| 6,064,140 | A * | 5/2000 | Zumeris | 310/323.02 |
| 6,242,846 | B1 * | 6/2001 | Ashizawa et al. | 310/323.02 |
| 6,806,620 | B1 * | 10/2004 | Wischnewskiy | 310/323.02 |
| 7,129,621 | B2 * | 10/2006 | Sakano et al. | 310/323.09 |
| 2006/0186760 | A1 * | 8/2006 | Sakano | 310/323.02 |

FOREIGN PATENT DOCUMENTS

| | | |
|---|---|---|
| JP | 03-195379 | 8/1991 |
| JP | 08-140373 | 5/1996 |
| JP | 08-182356 | 7/1996 |

\* cited by examiner

*Primary Examiner*—Mark Budd
(74) *Attorney, Agent, or Firm*—Volpe and Koenig, P.C.

(57) ABSTRACT

An ultrasonic motor includes an annular stator, a rotor, a rectangular parallelepiped multilayer piezoelectric transducer, a support shaft, three transducers with drivers, a holder for holding the transducers with an elastic plate therebetween, and a leaf spring for urging the holder. The holder having the transducers is inserted into transducer attaching holes arranged at positions where the circumference of the stator is divided into three parts in a state wherein the holder is urged by the leaf spring from the back of the holder. The leaf spring abuts and urges the drivers of the transducer against a hardwearing ring fixed to the outer circumference of the rotor on the side of the internal circumference of the stator. When the transducer is driven so as to excite an elliptical movement produced in the drivers by combining a bending standing-wave vibration with a longitudinal vibration, the rotor is rotated relative to the stator. This ultrasonic motor can be used for a drive source of an object of rotation with small frictional loss and improved conversion efficiency.

22 Claims, 12 Drawing Sheets

OPTICAL AXIS O SIDE

OPTICAL AXIS O SIDE

OPTICAL AXIS O SIDE

ULTRASONIC MOTOR

This application claims benefit of Japanese Applications No. 2004-144172 filed in Japan on May 13, 2004, the contents of which are incorporated by this reference.

BACKGROUND OF THE INVENTION

1. Field of the Invention

The present invention relates to an ultrasonic motor using a transducer exciting an elliptical movement produced by combining a bending standing-wave vibration with a longitudinal vibration.

2. Description of the Related Art

A linear ultrasonic motor that relatively moves a driven object by urging a transducer in contact with an elastic body, the transducer being composed of a piezoelectric element exciting an elliptical movement produced by combining a bending standing-wave vibration with a longitudinal vibration, is disclosed in Japanese Patent Publication No. 2871768 and Japanese Unexamined Patent Application Publication No. 8-182356.

An ultrasonic motor for driving a body of rotation proposed in Japanese Patent Publication No. 3401097 is an ultrasonic actuator including an ultrasonic actuator body, which is a set of circular transducers composed of a multilayer piezoelectric transducer, an elastic body, and a sliding member, a flame clamping the actuator and supporting a rotor (below-mentioned), and the rotor with a shaft. The ultrasonic actuator excites an elliptical vibration form the ultrasonic actuator body so as to rotate the rotor via the sliding member.

SUMMARY OF THE INVENTION

An ultrasonic motor according to the present invention has a suitable structure for an annular drive source with small frictional loss and improved motor efficiency.

According to a first aspect of the present invention, an ultrasonic motor includes at least one transducer exciting an elliptical vibration produced by combining a bending standing-wave vibration with a longitudinal vibration; a body of rotation rotatable about a rotational axis relatively to the transducer by the effect of the elliptical vibration of the transducer arranged at a predetermined position along a circumference; a support member for restricting the movement of the transducer along the rotational axis and in the circumferential direction as well as for supporting the transducer movably in a direction toward the rotational axis of the body of rotation; and an urging member provided in the support member for urging the transducer toward the rotational axis of the body of rotation so that the transducer being movable in the direction toward the rotational axis of the body of rotation is in contact usually with the circumference of the body of rotation.

According to a second aspect of the present invention, an ultrasonic motor includes at least one transducer exciting an elliptical vibration produced by combining a bending standing-wave vibration with a longitudinal vibration; a body of rotation rotatable about a rotational axis relatively to the transducer by the effect of the elliptical vibration of the transducer arranged at a predetermined position along a circumference; a transducer holder for holding the transducer rotatably about the axis substantially in parallel with the rotational axis of the body of rotation at a nodal point which is a neutral point of the combined elliptical vibration; a support member for supporting the transducer holder movably in a direction toward the rotational axis of the body of rotation by restricting the position of the transducer holder; and an urging member provided in the support member for urging the transducer holder toward the rotational axis of the body of rotation so that the transducer being movable in the direction toward the rotational axis of the body of rotation is usually in contact with the circumference of the body of rotation.

Other features and advantages of the present invention will be apparent from the description below.

DESCRIPTION OF THE PREFERRED EMBODIMENTS

Embodiments of the present invention will be described below with reference to the drawings.

Figure 1:
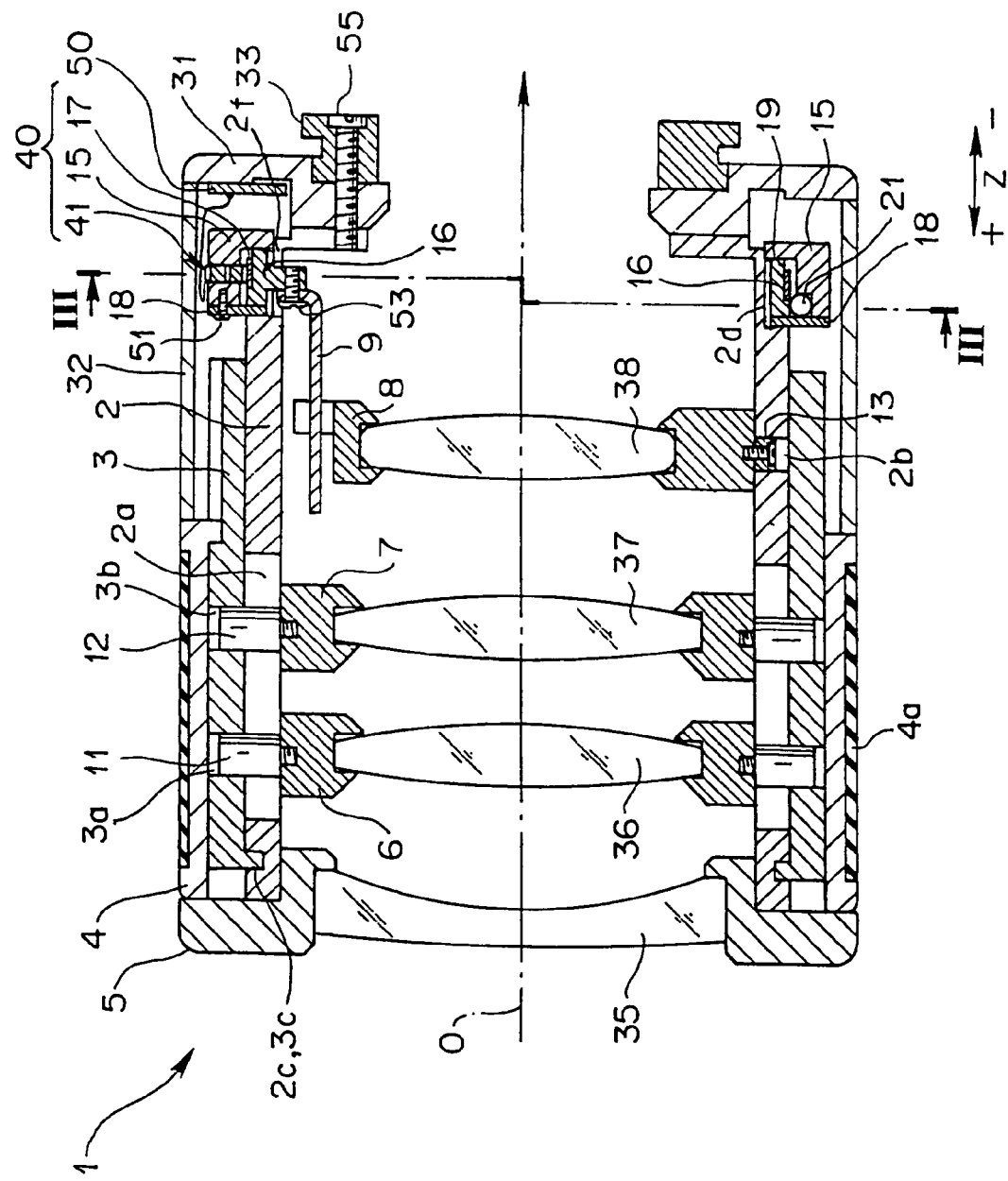
FIG. 1 is a longitudinal sectional view, along an optical axis, of a lens barrel having an ultrasonic motor according to a first embodiment of the present invention mounted thereon.
Figure 2:
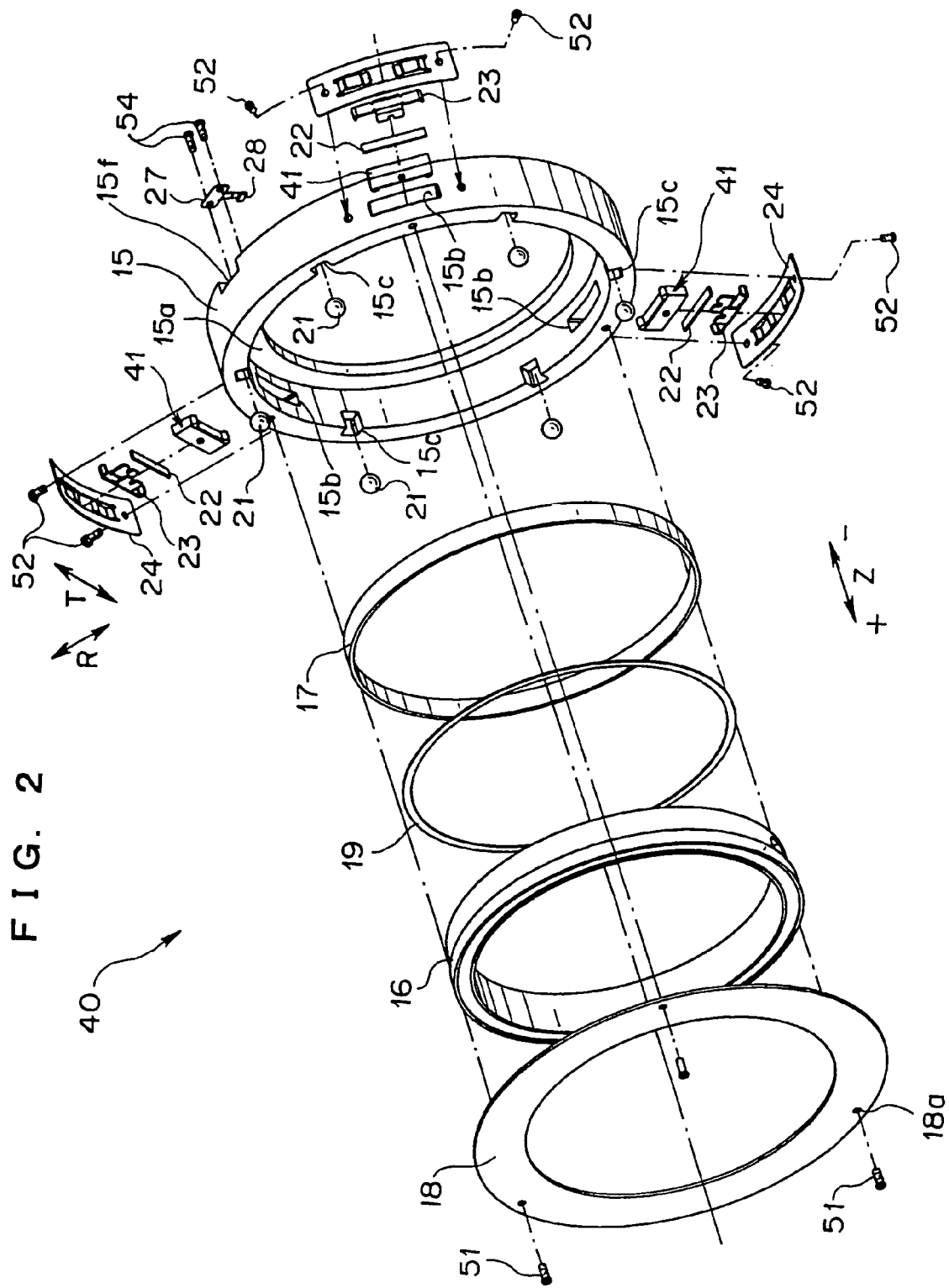
FIG. 2 is an exploded perspective view of the ultrasonic motor mounted in the lens barrel of FIG. 1.
Figure 3:
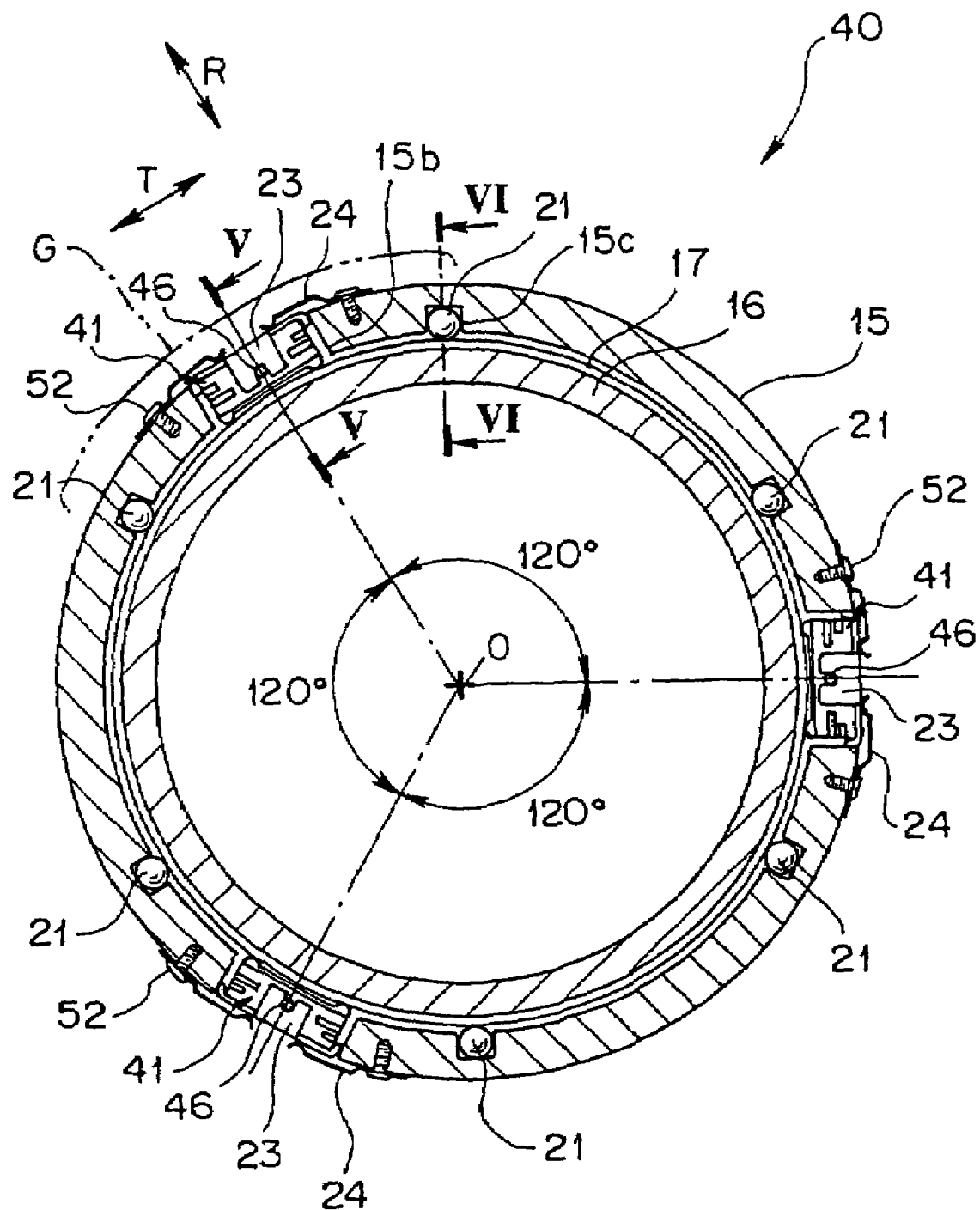
FIG. 3 is a sectional view at the line III-III of FIG. 1.
Figure 4:
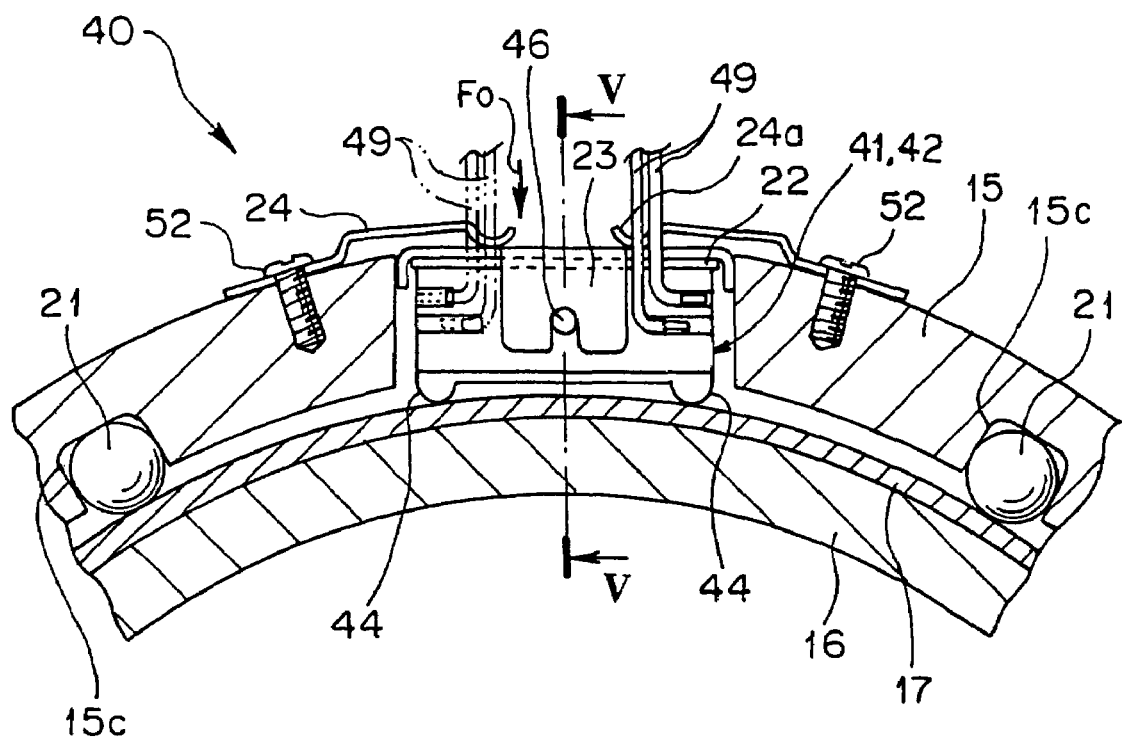
FIG. 4 is an enlarged view of G portion of FIG. 3.
Figure 5:
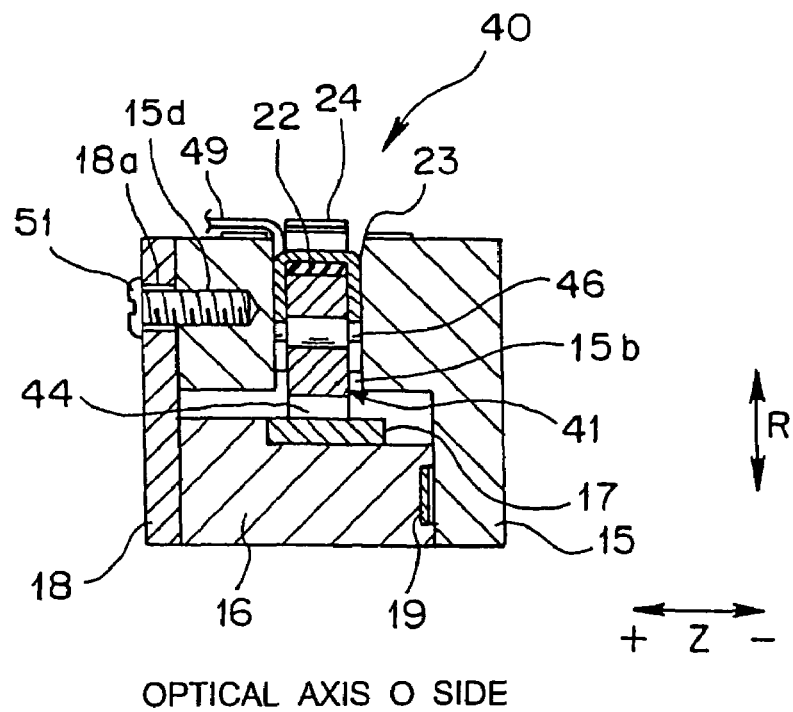
FIG. 5 is a partially enlarged sectional view at the line V-V of FIG. 3 or 4.
Figure 6:
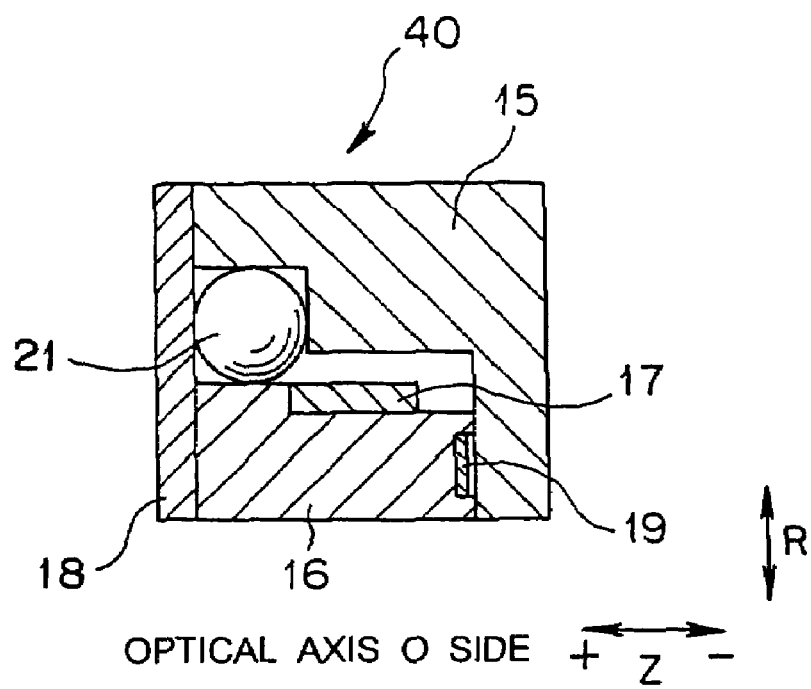
FIG. 6 is a partially enlarged sectional view at the line VI-VI of FIG. 3.
Figure 7:
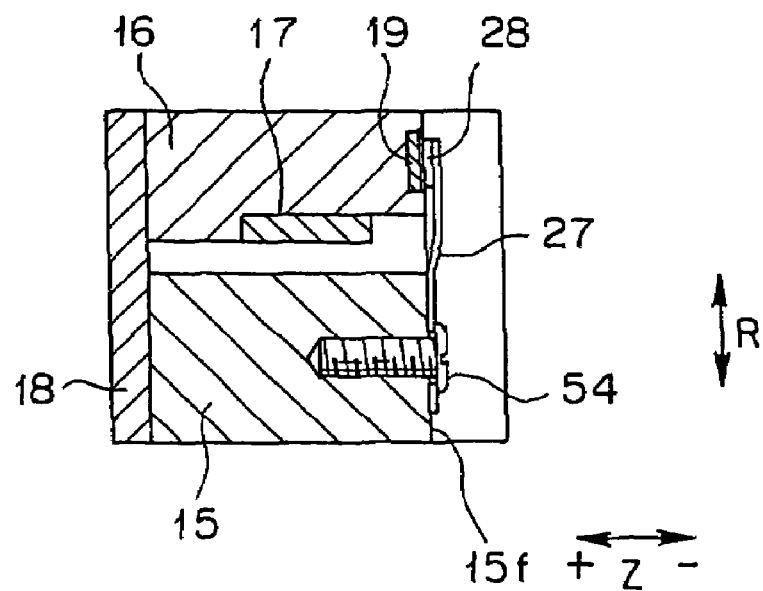
FIG. 7 is an enlarged sectional view of the vicinity of a magnetic sensor of the ultrasonic motor of FIG. 2.
Figure 8:
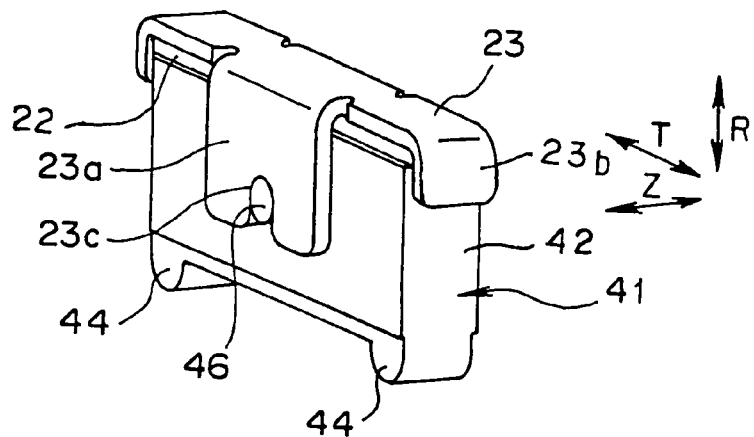
FIG. 8 is a perspective view of contours of the transducer of the ultrasonic motor and a transducer holder of the ultrasonic motor of FIG. 2.
Figure 9:
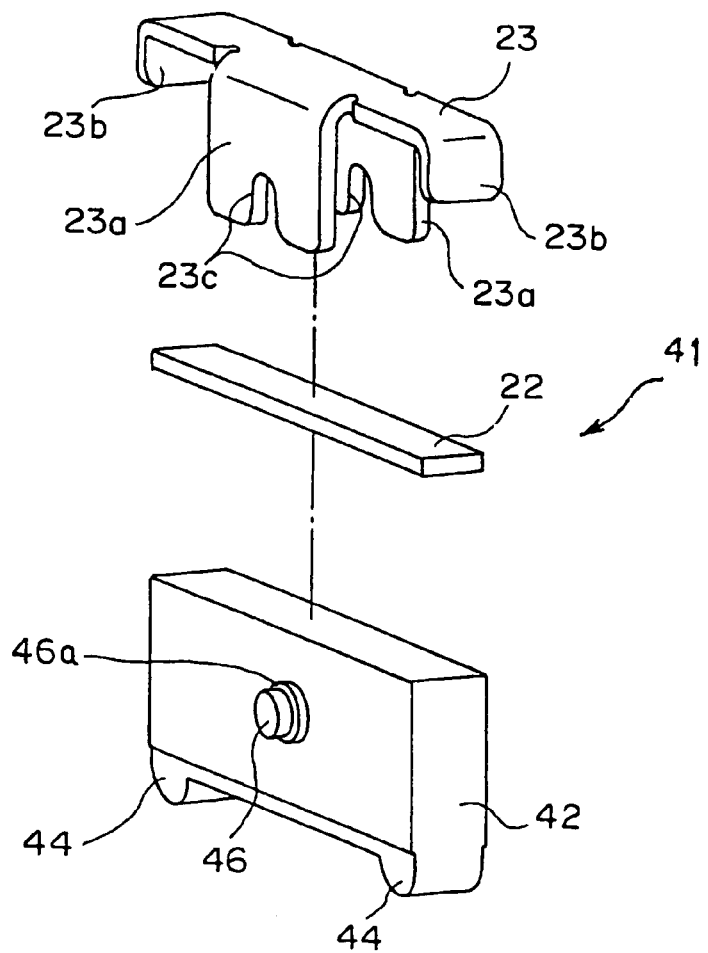
FIG. 9 is an exploded perspective view of the transducer and the transducer holder of the ultrasonic motor of FIG. 2.

FIG. 1 is a longitudinal sectional view, along an optical axis, of a lens barrel having an ultrasonic motor according a first embodiment of the present invention mounted thereon; FIG. 2 is an exploded perspective view of the ultrasonic motor; FIG. 3 is a sectional view at the line III-III of FIG. 1; FIG. 4 is an enlarged view of G portion of FIG. 3 showing a mounted transducer of the ultrasonic motor; FIG. 5 is a partially enlarged sectional view at the line V-V of FIG. 3 or 4 showing the vicinity of the transducer; FIG. 6 is a partially enlarged sectional view at the line VI-VI of FIG. 3 showing the vicinity of ball bearings; FIG. 7 is an enlarged sectional view of the vicinity of a magnetic sensor of the lens barrel; FIG. 8 is a perspective view of contours of the transducer of the ultrasonic motor and a transducer holder; and FIG. 9 is an exploded perspective view of the transducer and the transducer holder.

In the description below, the optical axis of a photographing lens composed of first to fourth lens groups is denoted as the optical axis O; the direction parallel with the optical axis O is denoted as the direction Z, in which symbol + denotes the object side, and symbol − denotes the focus side. The radial direction about the optical axis O is denoted as the direction R; and the tangential direction to a circumference of the optical axis O is denoted as the direction T. In addition, the optical axis O substantially agrees with the rotation shaft center of the stator and the rotor (below-mentioned).

A lens barrel 1 according to the embodiment, as shown in FIG. 1, includes a fixed frame 2, a cam ring 3 supported on the external surface of the fixed frame 2, a zoom ring 4 fitted onto the circumference of the cam ring 3, a first group lens frame 5 holding a first lens group 35, a second group lens frame 6 located in the rear of the first group lens frame 5 for holding a second lens group 36, a third group lens frame 7 located in the rear of the second group lens frame 6 for holding a third lens group 37, a fourth group lens frame 8 located in the rear of the third group lens frame 7 for holding a fourth lens group 38 that is a focus lens, and an ultrasonic motor 40 as a drive source.

The fixed frame 2 is an annular frame member, and includes at the annular part a circumferential guide groove 2c, a linear guide groove 2a arranged along the direction Z, a cam groove 2b slanting to the direction Z, and further an outer circumference 2d for fitting the stator therewith, and a notch 2f for inserting a focus drive arm thereinto. The fixed frame 2 is integrated on the rear end face with an end plate 31, a mount 33, and a screw 55. To the end plate 31, an external frame 32 is firmly fixed.

The cam ring 3 is an annular frame member, and is rotatably fitted onto the circumference of the fixed frame 2. Furthermore, an internal projection 3c is fitted into the circumferential guide groove 2c so as to be rotatably supported to the fixed frame 2 in a restricted state in the direction Z. The cam ring 3 is provided with two cam grooves 3a and 3b slanting to the direction Z formed in its annular portion.

The zoom ring 4 is an annular frame member, and is fitted onto the circumference of the cam ring 3 integrally in both the direction Z and the rotational direction. On the circumference of the zoom ring 4, a grabbing rubber ring 4a is stuck.

The first group lens frame 5 is fixed on the front end of the fixed frame 2.

The second and third group lens frames 6 and 7 are fitted into the fixed frame 2, and are provided with cam followers 11 and 12 fixed on their circumferences, respectively. The cam followers 11 and 12 are inserted into the linear guide groove 2a of the fixed frame 2 so as to be thereby guided, and are slidably fitted into the cam grooves 3a and 3b of the cam ring 3, respectively. Thus, when the cam ring 3 is rotated by the zoom rotation of the zoom ring 4, the second and third group lens frames 6 and 7 are driven by the cam grooves 3a and 3b via the cam followers 11 and 12, respectively, so as to move to the respective zoom positions along the optical axis O.

The fourth group lens frame 8 is fitted into the fixed frame 2, and is provided with cam followers 13 fixed on its circumference. The cam followers 13 are slidably fitted into the cam groove 2b of the fixed frame 2. The fourth group lens frame 8 is provided with a guide groove 8a arranged along the direction Z. The distal end of a focus drive arm 9 is slidably fitted into the guide groove 8a. The focus drive arm 9 is fixed to a rotor 16 of the ultrasonic motor 40. Thus, as described later, when the rotor 16 of the ultrasonic motor 40 is rotated during focus driving, the fourth group lens frame 8 is rotated relatively to the fixed frame 2 via the focus drive arm 9. By the rotation, the cam followers 13 slide through the cam groove 2b so that the rotating fourth group lens frame 8 moves along the direction Z (the optical axis O) to the focus position.

The ultrasonic motor 40 is an actuator for driving the fourth group lens frame 8 for focusing and, as shown in FIGS. 1 and 2, it includes a stator 15 as a support member, the rotor 16 having a hardwearing ring 17 fixed on the outer circumference as a body of rotation, a rotor press plate 18, three transducers 41 exciting an elliptical movement produced by combining a bending standing-wave vibration with a longitudinal vibration as a drive source of the motor, six bearing balls 21 for receiving the rotor/the stator in the radial direction, an urging leaf spring 24 as an urging member, a sensor support plate 27, and a magnetic sensor unit comprising a magnetic sensor 28.

The rotor 16, as shown in FIG. 2, is an annular member having the hardwearing ring 17 bonded on the circumference and made of a hardwearing material, such as ceramics, and it further includes a magnetic tape 19 protected by a polyester film and bonded at its end face on the −Z side. The rotor 16 is put loosely on the outer circumference 2d of the fixed frame 2.

The ring-shaped stator 15, as shown in FIG. 2, is provided with a flange 15a formed on the internal circumference, through holes 15b formed at three positions where the circumference is divided into three equal parts for attaching transducers thereto, ball insertion notches 15c formed on both sides of each through hole 15b on the internal circumference on the +Z end-face side, six notches 15c in total, and a recess 15f for attaching a sensor plate thereto. The stator 15 is fixed by fitting the flange 15a onto the rear circumference 2d of the fixed frame 2 from the rear of the rotor 16.

The balls 21 are for relieving the rotational fiction between the stator and the rotor constituting the mechanism for receiving the rotor/the stator in the radial direction, and as shown in FIG. 3, are fitted into the ball insertion notches 15*c*. The external surface of the ball very slightly protrudes inside the stator 15 so that the rotor 16 is rotated relatively to the stator 15 interposing the balls 21 therebetween when the stator 15 is fitted onto the circumference of the rotor 16. The hardwearing ring 17 is fixed onto the rotor 16 in practice, as described later, the balls 21 come in contact with the hardwearing ring 17. In addition, instead of the balls 21, roller rolling bodies may also be applied.

The sensor support plate 27 for the magnetic sensor 28 is fixed to the recess 15*f* of the stator 15 with screws 54. In this state, the magnetic sensor 28 is brought into sliding contact with the magnetic tape 19 of the rotor 16 so as to detect a rotation amount of the rotor 16 (FIG. 7).

The ring-shaped rotor press plate 18 includes screw insertion holes 18*a* formed therein, and is fixed to the +Z end face of the stator 15 with screws 51.

The three transducers 41, as shown in FIGS. 4, 8, and 9, each includes a multilayer piezoelectric transducer 42, drivers 44, a support shaft 46 as a neutral shaft, a transducer holder 23 for holding the multilayer piezoelectric transducer 42, and an elastic plate 22 elastically deformable in the thickness direction and clamped between the multilayer piezoelectric transducer 42 and the transducer holder 23.

The support shaft 46 penetrates the multilayer piezoelectric transducer 42 in the laminating direction through a node position (neutral position) of the vibration of the multilayer piezoelectric transducer 42 so as to be bonded, and both ends of the shaft protrude from the multilayer piezoelectric transducer 42.

The drivers 44 are a pair of projections fixed on one side face of the multilayer piezoelectric transducer 42 in the longitudinal direction (the direction T) in a direction perpendicular to the support shaft 46, and is arranged at an end position in the longitudinal direction.

The transducer holder 23, as shown in FIGS. 8 and 9, includes both-side folded portions 23*a* in the direction Z and both-side folded portions 23*b* in the direction T. The folded portion 23*a* is provided with a shaft-support notch 23*c* for rotatably fitting the support shaft 46 by fitting onto a step 46 of the support shaft 46. The transducer holder 23 can be supported slidably in the direction R without clearance in the directions T and Z by fitting the folded portions 23*a* and 23*b* of the transducer holder 23 into the through holes 15*b* of the stator 15 for attaching the transducers in the direction R.

The elastic plate 22 is elastically compression deformable in the thickness direction, and is inserted between the multilayer piezoelectric transducer 42 and the transducer holder 23 so as to prevent the transducer 41 from inclining about the support shaft 46 without inhibiting the vibration of the transducer 41.

The three transducers 41, as shown in FIGS. 4 and 5, are mounted on the stator 15 in an accommodated state within the transducer holder 23 and an urged state by an urging leaf spring 24 by inserting the respective transducers 41 into the through holes 15*b* of the stator 15 for attaching the transducers from the outside. The three transducers are arranged at positions on the circumference of the stator 15 where the angle about the axis of the stator 15 is divided into three equal angles of 120° (FIG. 3).

The transducers 41 mounted on the stator are held via the transducer holder 23 without clearance in the directions Z and T. Around the support shaft, the transducer 41 is rotatably supported by the transducer holder 23, and the upper surface of the transducer 41 is pressurized with two press parts 24*a* of the urging leaf spring 24 with the elastic plate 22 therebetween from the outside. This urging force F0 is transmitted to the transducer 41 via the support shaft 46. The drivers 44 of the transducer 41 abut the hardwearing ring 17 of the rotor 16 so as to be restricted in inclination by the elastic plate 22, so that the transducer 41 can be stably held without inclination. Thereby, the rotor 16 generates a centripetal force in the stator 15 in the optical axial direction O.

As described above, the support shaft 46 of the transducer 41 is supported in the direction Z while the two drivers 44 are arranged along the direction T. The drivers 44 slightly protrude from the internal circumference of the stator 15, and its tiny protruded amount is substantially the same as that of the ball 21.

In addition, the transducer 41 will be described more in detail later.

The rotor 16 is loosely inserted in the circumference 2*d* at the rear of the fixed frame 2 in a state in which the focus drive arm 9 is fixed. As described above, the stator 15 having the transducers 41, the transducer holder 23, the urging leaf spring 24, and the balls 21 mounted thereon is fitted and fixed in the circumference 2*d* of the fixed frame 2 at the rear of the rotor 16 from the −Z side. The stator 15 is rotatably fitted onto the rotor 16 without clearance in the radial direction with the balls 21 therebetween. The screws 51 inserted into the screw insertion holes 18*a* of the rotor press plate 18 are screwed into the end face on the +Z side of the stator 15 so as to restrict positions of the rotor 16 and the balls 21 in the direction Z (FIGS. 5 and 6). The focus drive arm 9 is fixed on the +Z side of the rotor 16 with a screw 53, and the end extremity of the focus drive arm 9 is slidably fitted into the guide groove 8*a* of the fourth group lens frame 8.

As described above, in the ultrasonic motor 40 mounted on the lens barrel 1, the stator 15 is fixed to the fixed frame 2 while the rotor 16 is rotatably supported to the fixed frame 2 in a restricted state of the movement in the direction Z in the internal circumference of the stator 15, and is also supported rotatably to the stator 15 with the bearing balls 21 therebetween. The drivers 44 of the transducer 41 mounted on the stator 15 abut the hardwearing ring 17 by the urging force F0 applied from the urging leaf spring 24. When the transducer 41 is driven so that the drivers 44 excite an elliptical vibration, the rotor 16 is rotated relative to the stator 15 through the hardwearing ring 17 abutting the drivers 44. By the rotation, the fourth group lens frame 8 is rotated so as to move back and forth in the optical axial direction O through the cam groove 2*b* of the fixed frame 2.

The configuration and effects of the transducer 41 herein will be described with reference to FIGS. 10 to 15 and FIGS. 16A to 16D.

Figure 10:
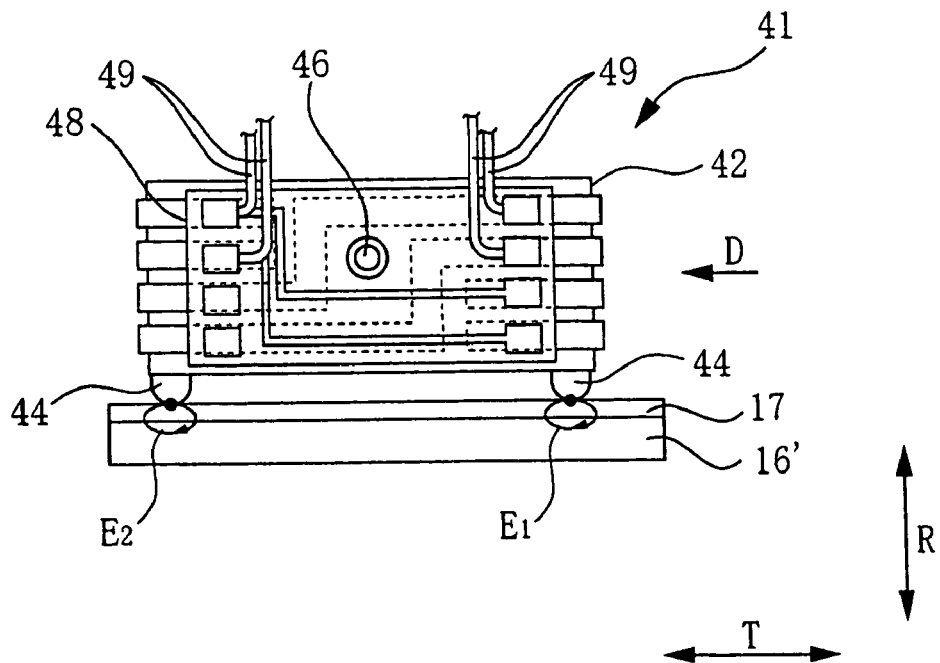
FIG. 10 is a drawing of the transducer of the ultrasonic motor of FIG. 2 having a flexible printed circuit board fixed thereto viewed from the support shaft.
Figure 11:
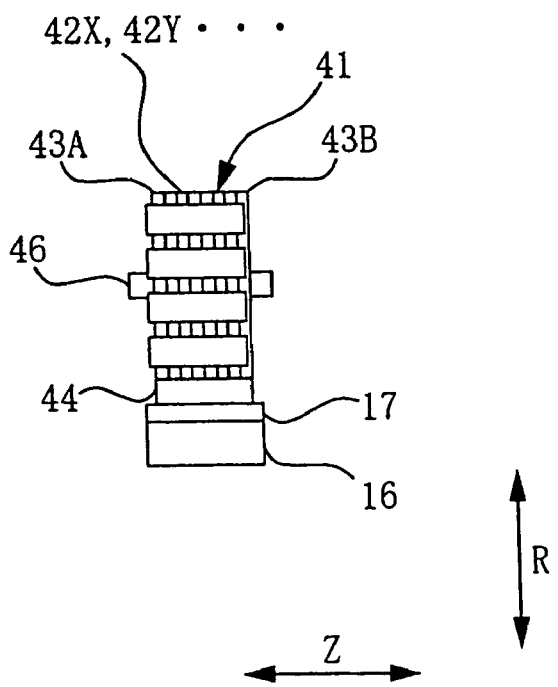
FIG. 11 is a drawing viewed in arrow D direction of FIG. 10.
Figure 12:
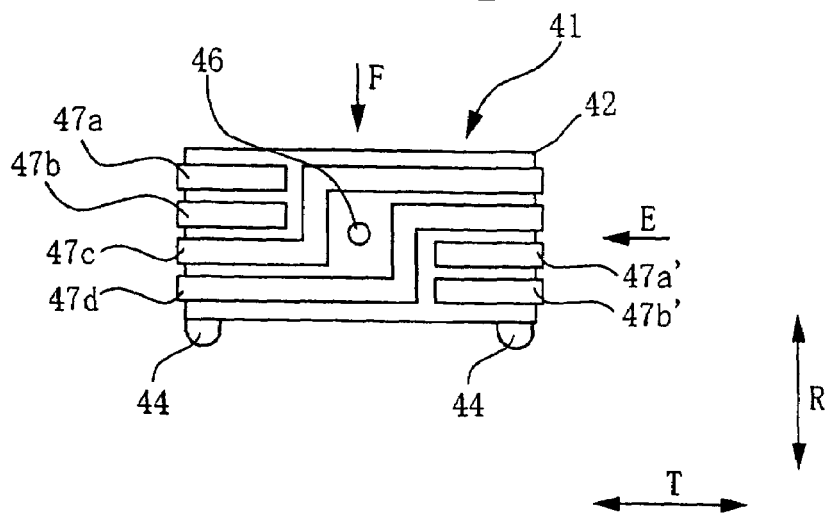
FIG. 12 is a drawing of a state in which the flexible printed circuit board is removed from the transducer in FIG. 10 viewed from the support shaft.
Figure 13:
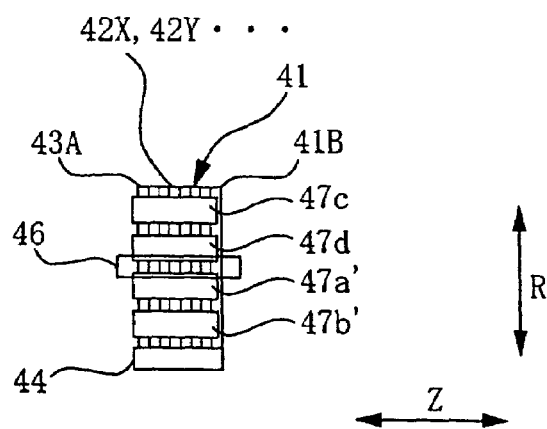
FIG. 13 is a drawing viewed in arrow E direction of FIG. 12.
Figure 14:
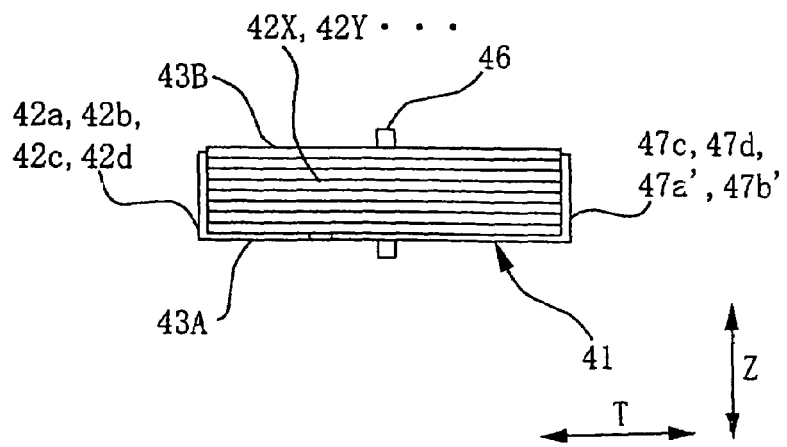
FIG. 14 is a drawing viewed in arrow F direction of FIG. 12.
Figure 15:
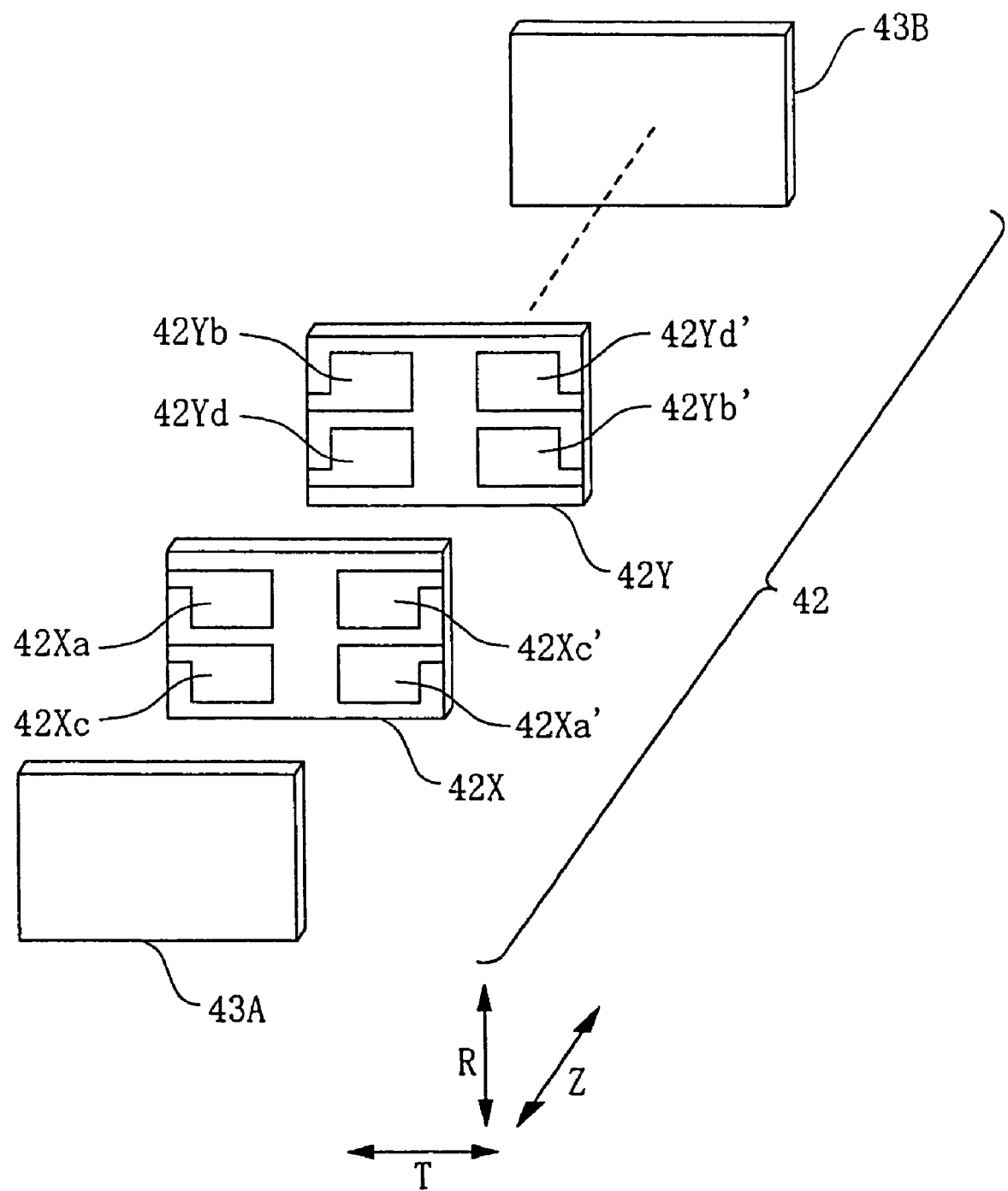
FIG. 15 is an exploded perspective view of a piezoelectric element and an insulation board constituting the transducer of FIG. 12 before a baking process.
Figure 16A:
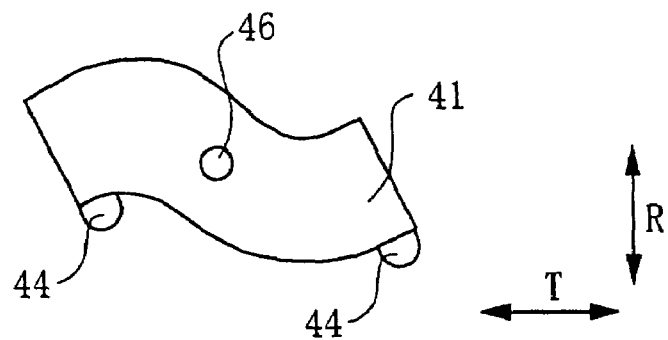
FIG. 16A shows a bending state in the composite vibration of the bending standing-wave vibration combined with the longitudinal vibration of the transducer of FIG. 12.
Figure 16B:
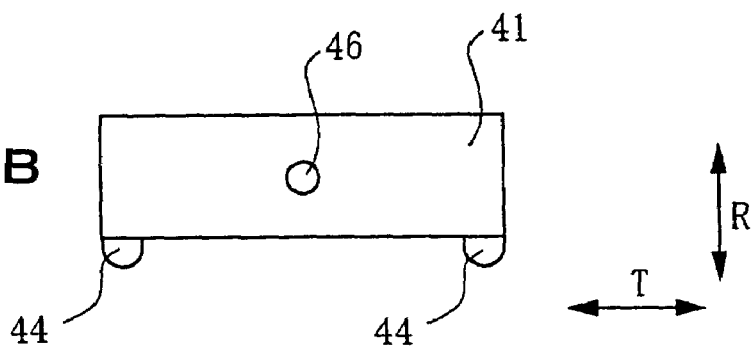
FIG. 16B shows an elongated state after the state of FIG. 16A in the composite vibration of the bending standing-wave vibration combined with the longitudinal vibration of the transducer of FIG. 12.
Figure 16C:
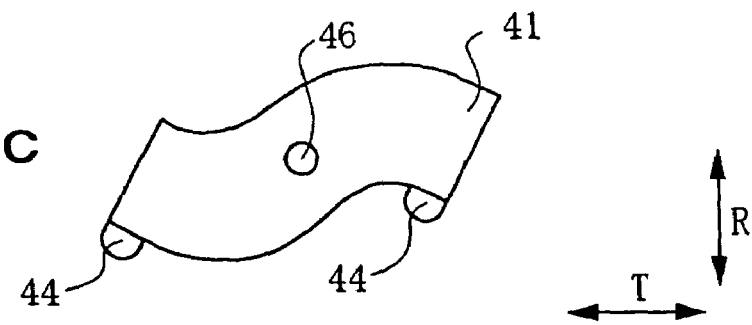
FIG. 16C shows a bending state after the state of FIG. 16B in the composite vibration of the bending standing-wave vibration combined with the longitudinal vibration of the transducer of FIG. 12.
Figure 16D:
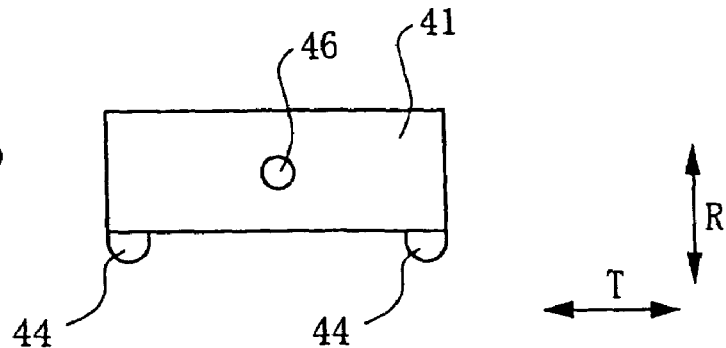
FIG. 16D shows a contraction state after the state of FIG. 16C in the composite vibration of the bending standing-wave vibration combined with the longitudinal vibration of the transducer of FIG. 12.

FIG. 10 is a drawing of the transducer 41 having a flexible printed circuit board 48 fixed thereto viewed from the support shaft; FIG. 11 is a drawing viewed in arrow D direction of FIG. 10; FIG. 12 is a drawing of a state in which the flexible printed circuit board 48 is removed from the transducer 41 in FIG. 10 viewed from the support shaft; FIG. 13 is a drawing viewed in arrow E direction of FIG. 12; FIG. 14 is a drawing viewed in arrow F direction of FIG. 12; FIG. 15 is an exploded perspective view of a piezoelectric element and an insulation board constituting the transducer 41 before a baking process; and FIGS. 16A to 16D are enlarged drawings of the composite vibration of the bending standing-wave vibration combined with the longitudinal vibration of the transducer 41 sequentially showing deformation states from a bending state of FIG. 16A, an elongated state of FIG. 16B, a bending state of FIG. 16C, to a contraction state of FIG. 16D.

The transducer 41 constituting the ultrasonic motor 40, as shown in FIGS. 12 and 15 and the like, includes a plurality of piezoelectric sheets of two kinds 42X and 42Y, the multilayer piezoelectric transducer 42 composed of two insulation plates 43A and 43B, electrodes 47a, 47b, 47c, 47d, 47a', and 47b' made of conductive silver paste, the one support shaft 46, and a pair of the drivers 44.

The respective two-kind piezoelectric sheets 42X and 42Y are composed of a rectangular piezoelectric element with a thickness of about 100 μm. The piezoelectric sheet 42X is provided with first internal electrodes 42Xa, 42Xc, 42Xc', and 42Xa' coated with a silver/palladium alloy with a thickness of about 10 μm so as to be divided into four insulated regions applied on the front surface. The upper end of each internal electrode extends to the end face of the piezoelectric element in the longitudinal direction (direction T) (FIG. 15).

On the other hand, the piezoelectric sheet 42Y is provided with second internal electrodes 42Yb, 42Yd, 42Yd', and 42Yb' coated with a silver/palladium alloy with a thickness of about 10 μm so as to be divided into four insulated regions applied on the front surface. The lower end of each internal electrode extends to the end face of the piezoelectric element in the longitudinal direction (direction T) (FIG. 15).

The first internal electrodes 42Xa, 42Xc, 42Xc', and 42Xa' and the second internal electrodes 42Yb, 42Yd, 42Yd', and 42Yb' of the respective piezoelectric sheets 42X and 42Y adjacent to each other are the same in shape while being upside down in electrode-end shape so that the rectangular electrode surfaces are overlapped with each other when the piezoelectric sheets are deposited. The two-kind piezoelectric sheets 42X and 42Y having such internal electrodes are alternately deposited so as to have about 40 layers in total.

As shown in FIG. 15, the deposited piezoelectric element is provided with an internal electrode exposed portion (not shown) formed on the left end face so as to expose ends of the first internal electrodes 42Xa and 42Xc and the second internal electrodes 42Yb and 42Yd in a deposited state. The deposited piezoelectric element is also provided with an internal electrode exposed portion (not shown) formed on the right end face so as to expose ends of the first internal electrodes 42Xc' and 42Xa' and the second internal electrodes 42Yd' and 42Yb' in a deposited state. Furthermore, on both side faces of the internal electrode exposed portions, external electrodes made of silver paste, four in total, are independently formed so as to be conductive to the internal electrodes (FIG. 13).

On the front and rear surfaces of the deposited piezoelectric element, insulation plates 43A and 43B with the same rectangular shape as that of the piezoelectric sheets 42X and 42Y are arranged, respectively, so as to constitute the multilayer piezoelectric transducer 42. On the surface of the front insulation plate 43A, electrodes 47a, 47b, 47c, 47d, 47a', and 47b' made of conductive silver paste are formed as shown in FIG. 12.

The electrodes 47a, 47b, 47c, 47d, 47a', and 47b' on the insulation plate 43A are electrically connected to the deposited both-side internal electrodes exposed to both sides for every layered piezoelectric sheet, respectively. That is, to the electrode 47a, the first internal electrode 42Xa is electrically connected; to the electrode 47b, the second internal electrode 42Yb is electrically connected; to the electrode 47c, the first internal electrode 42Xc and the first internal electrode 42Xc' are electrically connected; to the electrode 47d, the second internal electrode 42Yd and the second internal electrode 42Yd' are electrically connected; to the electrode 47a', the first internal electrode 42Xa' is electrically connected; and to the electrode 47b', the second internal electrode 42Yb' is electrically connected.

When the multilayer piezoelectric transducer 42 having the insulation plates 43A and 43B overlapped thereon is baked on the deposited piezoelectric sheets 42X and 42Y in the electrode-connection state so as to polarize the multilayer piezoelectric transducer 42 using the above-mentioned electrodes, it becomes the transducer 41.

At end positions in the direction T on the end face of the transducer 41 in the direction R (the direction perpendicular to the depositing direction), a pair of the drivers 44 are bonded, respectively. In addition, the driver 44 is formed by dispersing alumina in a high polymeric material.

Furthermore, at the substantial center of the transducer 41, which is the vibration neutral point (node position) of the transducer, a through-hole is formed in the depositing direction (the direction Z). The support shaft 46 made of stainless steel or the like is penetrated through the through-hole in the direction Z so as to be bonded (FIG. 13).

On the electrodes 47a, 47b, 47c, 47d, 47a', and 47b' provided on the insulation plate 43A of the transducer 41, a flexible printed circuit board 48 having a connection pattern is mounted in an electrically connected state to the respective electrodes. To the flexible printed circuit board 48, lead wires 49 are connected for applying drive voltage (FIG. 10). The lead wires 49 are connected to a transducer drive circuit via a printed circuit board 50.

The transducer drive circuit includes an oscillation circuit, a phase-shift circuit, and a drive circuit, and it applies the phase-controlled drive voltage to the transducer 41 via the drive circuit.

The transducer 41 is driven by the drive voltage via the lead wires 49 so as to generate the composite vibration of the bending standing-wave vibration combined with the longitudinal vibration shown in FIGS. 16A to 16D. Thereby, out of phase elliptical vibrations (trajectories E1 and E2 shown in FIG. 10) are generated at ends of the drivers 44. Since at the ends of the drivers 44, the hardwearing ring 17 of the rotor 16, which is a driven object, is urged, the rotor 16 is rotated relatively to the stator 15 via the drivers 44 in the rotational direction of the elliptical vibration.

In the lens barrel 1 constructed as described above, upon focus driving, when the transducer 41 is driven by the transducer drive circuit so that the drivers 44 are vibrated along elliptical trajectories, the rotor 16 is rotated relative to the stator 15 and the fixed frame 2 in any direction. By the rotation of the rotor, the fourth group lens frame 8 is rotated via the focus drive arm 9 so as to move to the focus position in the optical axial direction O along the cam groove 2b of the fixed frame 2.

As described above, the ultrasonic motor 40 assembled in the lens barrel 1 according to the embodiment has a structure preferable for a drive source of an object of rotation with small frictional loss and improved motor efficiency. That is, in the above-mentioned ultrasonic motor 40, the three transducers 41 are arranged at positions where the circumference of the stator 15 is divided into three equal parts, respectively, and urging forces F0 of the urging leaf spring 24 are applied in the optical axial direction O from three directions. Accordingly, the drivers 44 of the transducer 41 uniformly abut the rotor 16, and the rotor 16 is driven in a state in which an unbalanced force is not applied thereto as well as the frictional loss due to the urging force F0 is difficult to be produced.

The transducers 41 held by the transducer holder 23 are fitted into the through holes 15*b* of the stator 15 for inserting the transducers without clearance. Thus, the transducers 41 are supported without clearance in the directions Z and T as well as movably only in the direction R in which the drivers 44 are arranged, so that the rotor 16 is rotated in high accuracy. Moreover, since the elastic plate 22 is interposed between the transducer 41 and the transducer holder 23, the inclination of the transducer 41 is restricted relative to the circumferential surface of the rotor 16, stabilizing the driving.

According to the embodiment described above, a structure is adopted in which the three transducers 41 are arranged at positions where the circumference of the stator 15 is divided into three equal parts, respectively; alternatively, the transducers may be arranged at any number of positions other than three divided into equal parts, or the transducer may be arranged in at least one position while interposing members such as rollers or balls may be arranged at other positions where the circumference of the stator 15 is divided into a plurality of equal parts, or the transducers may also be arranged at the entire positions. Also, the balls 21 as objects of rolling applied to the mechanism for receiving the rotor/the stator in the radial direction may be replaced by rollers.

Figure 17:
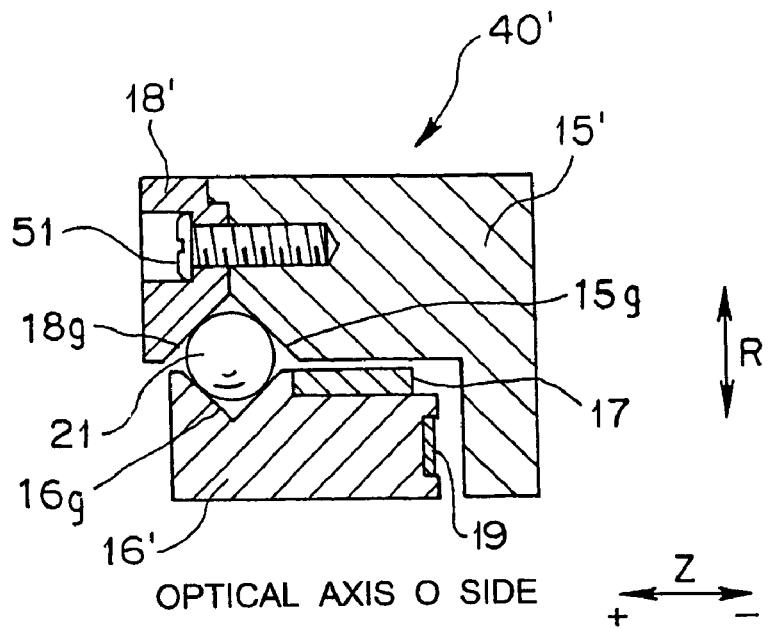
FIG. 17 is an enlarged sectional view of a mechanism for receiving a rotor/a stator of the ultrasonic motor of FIG. 2 in the radial direction modified from that of the first embodiment.

Next, a modification with regard to a stator/rotor fitting mechanism of the ultrasonic motor 40 according to the first embodiment will be described with reference to the enlarged sectional view of the stator/rotor receiving mechanism in the radial direction of FIG. 17.

In this modification, only a ball support structure provided in the fitting portion between the stator and the rotor in the stator/rotor receiving mechanism in the radial direction is different from that of the embodiment described above. That is, as shown in FIG. 17, on the front surface of a stator 15', a ring-shaped press plate 18' can be fixed, and the junction between the stator 15' and the press plate 18' is provided with cut-surfaces 15*g* and 18*g* formed along the circumferential direction. Also, a rotor 16' is provided with a V-groove 16*g* formed to oppose the above-mentioned junction along its circumferential direction. The rotor 16', having rolling bearing balls 21 inserted into the V-groove 16*g* is inserted into the circumference of the stator 15'. Then, when the press plate 18' is fixed on the front surface of the stator 15' with screws 51, the balls 21 are supported with the V-groove 16*g* and the cut-surfaces 15*g* and 18*g*. In addition, a plurality of the balls 21 are arranged in the circumferential direction and are held by retainers (not shown).

In the fitting state mentioned above, the rotor 16' is rotatably supported by the stator 15' with the balls 21 rotatably interposed therebetween while being restricted in position by the balls 21 in the direction Z relative to the stator 15'. Thus, any separate member for restricting the movement of the rotor 16' in the direction Z is not required, so that clearances can be provided on both sides of the rotor 16'.

According to the modification, an ultrasonic motor can be provided that has improved conversion efficiency and is capable of driving the rotor with high accuracy, because the rotor 16' can be rotated relatively to the stator 15' with a small rotational load and the restriction of the rotor 16' in position in the direction Z can be eliminated due to the positioning in the direction Z (axial direction) with the balls 21.

Next, an ultrasonic motor according to a second embodiment of the present invention will be described with reference to the enlarged sectional view of the vicinity of the transducer of FIG. 18.

In an ultrasonic motor 40A according to the embodiment, the positioning structure of the rotor is different from that of the ultrasonic motor 40, which is applied to the lens barrel 1 according to the first embodiment. That is, the sectional shape of a hardwearing ring of the rotor 16 abutted by the drivers of the transducer is different and other components are substantially the same.

Figure 18:
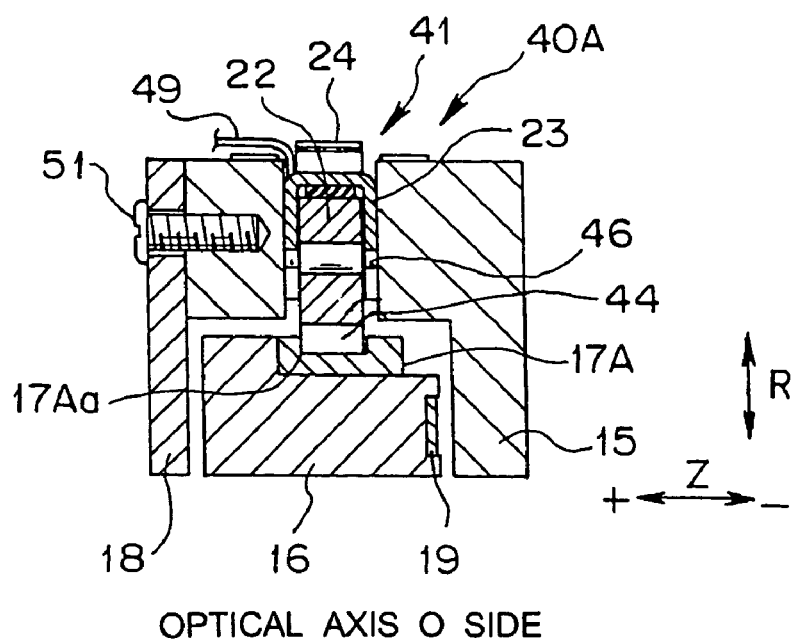
FIG. 18 is an enlarged sectional view of the vicinity of a transducer of an ultrasonic motor according to a second embodiment of the present invention.

In the ultrasonic motor 40A, as shown in FIG. 18, the hardwearing ring 17A fixed to the circumference of the rotor 16 is provided with recesses (grooves) 17A*a* formed on the outer circumference in the peripheral direction for fitting the drivers 44 thereinto. The recess 17A*a* has a width in the direction Z capable of fitting the driver 44 without clearance. Hence, the rotor 16 is restricted in position in the direction Z by the drivers 44 of the transducer 41 so as to have no separate member therefor, and have clearances provided on its both sides in the direction Z. The driver 44 may have a circular arc shape at its end along the peripheral direction of the recess 17A*a*.

According to the ultrasonic motor 40A of this embodiment, it is not necessary to have a position restrictive part in the direction Z provided outside the rotor, so that the structure is simplified and the frictional loss due to the position restrictive part in the direction Z is eliminated, thereby providing an efficient ultrasonic motor.

Next, a modification with regard to a rotor positional restricting mechanism of the ultrasonic motor according to the second embodiment will be described with reference to the enlarged sectional view of the vicinity of the transducer of FIG. 19.

In an ultrasonic motor 40A' according to this modification, the distal end shape of the driver provided in the transducer and the shape of a hardwearing ring 17A' to be fitted by the driver are different from those of the ultrasonic motor 40A according to the second embodiment described above.

Figure 19:
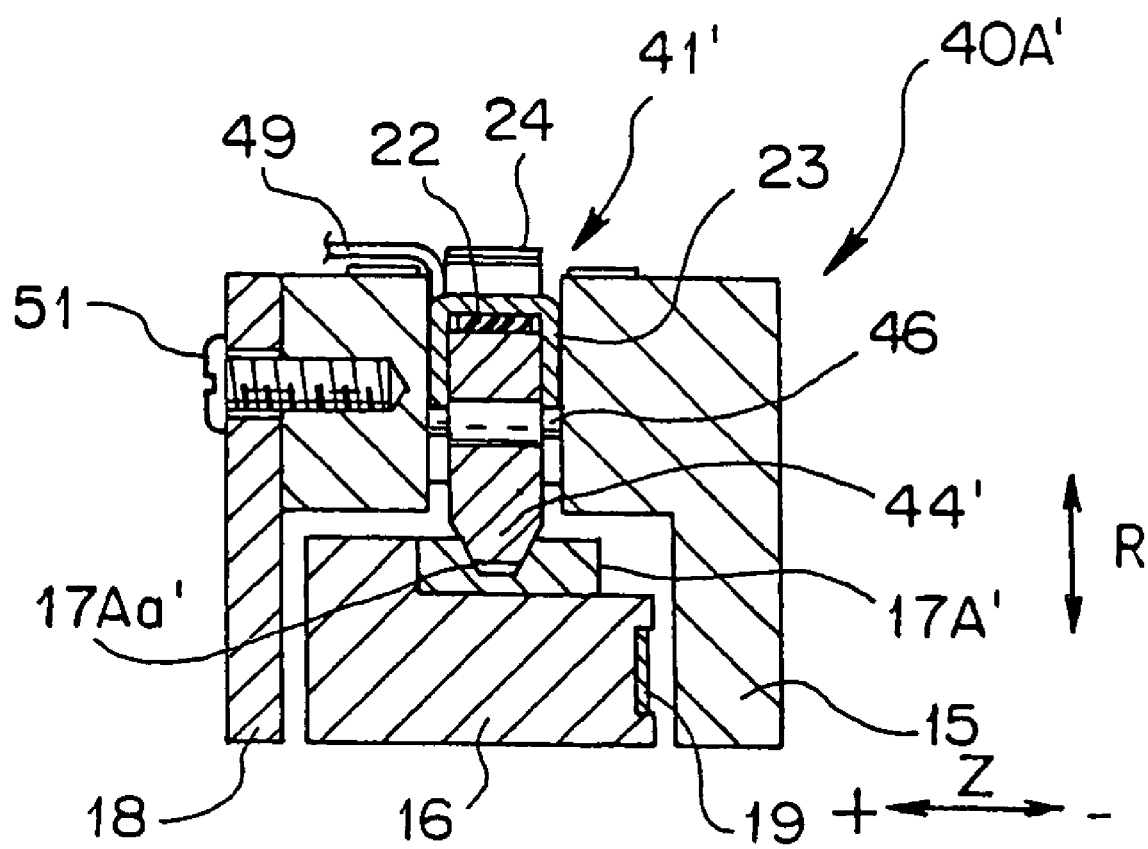
FIG. 19 is an enlarged sectional view of the vicinity of the transducer of the ultrasonic motor according to the second embodiment of FIG. 18 in a modified position restrictive mechanism of the rotor.

In the ultrasonic motor 40A' according to the modification, as shown in FIG. 19, a driver 44' of a transducer 41' is formed to have a wedge-shaped end. A portion of the hardwearing ring 17A' fixed to the circumference of the rotor 16 abutting drivers 44' is provided with a circumferential inclined groove 17A*a*' to be fitted to the wedge-shaped end. The wedge-shaped end of the driver 44' fits into the circumferential inclined groove 17A*a*' of the hardwearing ring 17A' without clearance so as to be abutted with a predetermined urging force. When the drivers 44' are driven, a driving force due to the elliptical vibration of the drivers 44' is transmitted to the rotor 16 via the circumferential inclined groove 17A*a*'.

According to the ultrasonic motor 40A' of this modification, the same effect as that of the second embodiment described above can be obtained.

The ultrasonic motor according to the present invention described above has a structure preferably used for a drive source of an object of rotation with small frictional loss and improved motor efficiency.

Drive sources according to the embodiments described above are ultrasonic motors; however, the spirit and scope of the present invention may incorporate oscillatory waves other that ultrasonic waves, so that a so-called oscillatory wave motor can be applied so as to have the same effects.

The present invention is not limited to the embodiments described above, so that various modifications may be made during an execution phase within the spirit and scope of the invention. Furthermore, the above-described embodiments include inventions at various stages so that various inventions can be extracted from appropriate combinations of a plurality of disclosed constituent features.

For example, even if several constituent features are omitted from the entire constituent features of the embodiments, when the problems described above can be solved and the effects described above can be obtained, from the constituent features other than the omitted features, an invention may be extracted.

What is claimed is:

1. An ultrasonic motor, comprising:
   at least one transducer exciting an elliptical vibration produced by combining a bending standing-wave vibration with a longitudinal vibration;
   a body of rotation rotatable about a rotational axis relative to the transducer by the effect of the elliptical vibration of the transducer arranged at a predetermined position along a circumference of the body of rotation;
   a support member for restricting movement of the transducer along the rotational axis and in the circumferential direction as well as for movably supporting the transducer in a direction toward the rotational axis of the body of rotation; and
   an urging member provided in the support member for urging the transducer toward the rotational axis of the body of rotation so that the transducer moveable in the direction toward the rotational axis of the body of rotation is usually in contact with the circumference of the body of rotation; and
   wherein the transducer is supported rotatably about an axis substantially in parallel with the rotational axis of the body of rotation.

2. The ultrasonic motor according to claim 1, further comprising a press member for clamping the body of rotation in the axial direction together with the support member so as to restrict the position of the body of rotation in the axial direction.

3. The ultrasonic motor according to claim 1, wherein a contact portion between the transducer and the body of rotation is formed so as to restrict the body of rotation in the axial direction at a predetermined position.

4. The ultrasonic motor according to claim 3, wherein the contact portion of the transducer to the body of rotation is formed to have one of a wedge-shaped end and a circular arc-shaped end, and
   wherein the body of rotation is provided with a recess to be substantially fitted onto the end of the contact portion of the transducer.

5. The ultrasonic motor according to claim 1, further comprising a plurality of rolling elements arranged along a circumference and between the support member and the body of rotation in the radial direction toward the rotational axis of the body of rotation so that the plurality of rolling elements come in contact with both the support member and the body of rotation for relieving a rotation frictional force of the body of rotation.

6. The ultrasonic motor according to claim 1, wherein the body of rotation generates a centripetal force in the support member in the axial direction, and is restricted in position along the axial direction.

7. The ultrasonic motor according to claim 6, further comprising a plurality of rolling elements arranged along a circumference and between the support member and the body of rotation in the radial direction toward the rotational axis of the body of rotation so that the plurality of rolling elements come in contact with both the support member and the body of rotation.

8. The ultrasonic motor according to claim 1, wherein a plurality of the transducers are arranged at substantially equal intervals in the circumferential direction of the body of rotation.

9. An ultrasonic motor comprising:
   at least one transducer exciting an elliptical vibration produced by combining a bending standing-wave vibration with a longitudinal vibration;
   a body of rotation rotatable about a rotational axis relative to the transducer by the effect of the elliptical vibration of the transducer arranged at a predetermined position along a circumference of the body of rotation;
   a transducer holder for enabling the transducer to rotate about an axis substantially in parallel with the rotational axis of the body of rotation at a nodal point which is a neutral point of vibration;
   a support member for enabling the transducer holder to move in a direction toward the rotational axis of the body of rotation by restricting the position of the transducer holder; and
   an urging member provided in the support member for urging the transducer holder toward the rotational axis of the body of rotation so that the transducer is movable in the direction toward the rotational axis of the body of rotation and is usually in contact with the circumference of the body of rotation.

10. The ultrasonic motor according to claim 9, wherein the transducer is supported for rotation only about the axis at the nodal point which is the neutral point of vibration.

11. The ultrasonic motor according to claim 9, further comprising an elastic body clamped within a gap between the transducer holder and the transducer in the direction toward the rotational axis of the body of rotation to restrict the rotation of the transducer about the axis without inhibiting the vibration.

12. The ultrasonic motor according to claim 9, wherein a plurality of the transducers are arranged at substantially equal intervals in the circumferential direction of the body of rotation.

13. An ultrasonic motor, comprising:
   at least one transducer exciting an elliptical vibration produced by combining a bending standing-wave vibration with a longitudinal vibration;
   a body of rotation rotatable about a rotational axis relative to the transducer by the effect of the elliptical vibration of the transducer arranged at a predetermined position along a circumference of the body of rotation;
   a support member for restricting movement of the transducer along the rotational axis and in the circumferential direction and enabling the transducer to move in a direction toward the rotational axis of the body of rotation; and
   an urging member provided in the support member for urging the transducer toward the rotational axis of the body of rotation so that the transducer is movable in the direction toward the rotational axis of the body of rotation and is usually in contact with the circumference of the body of rotation;
   wherein a contact portion between the transducer and the body of rotation is formed so as to restrict the body of rotation in the axial direction at a predetermined position.

14. The ultrasonic motor according to claim 13, wherein the contact portion of the transducer to the body of rotation is formed to have one of a wedge-shaped end and a circular arc-shaped end, and wherein the body of rotation is provided with a recess to be substantially fitted onto an end of the contact portion of the transducer.

15. The ultrasonic motor according to claim 1, wherein the transducer comprises two drivers in contact with the body of rotation.

16. The ultrasonic motor according to claim 15, wherein the transducer further comprises a support shaft arranged at a node which is a neutral position of vibration, the transducer rotating about the support shaft and being supported for rotation about an axis that is generally parallel to the rotational axis of the body of rotation.

17. The ultrasonic motor according to claim 16, wherein the support shaft is arranged between the two drivers, in a direction of arrangement of the two drivers.

18. The ultrasonic motor according to claim 9, wherein the transducer comprises two drivers in contact with the body of rotation.

19. The ultrasonic motor according to claim 18, wherein the nodal point which is a neutral point of vibration of the transducer is arranged between the two drivers, in a direction of arrangement of the two drivers.

20. An ultrasonic motor comprising:
at least one transducer exciting an elliptical vibration produced by combining a bending standing-wave vibration with a longitudinal vibration;
a body of rotation rotatable about a rotational axis relative to the transducer by the effect of the elliptical vibration of the transducer arranged at a predetermined position along a circumference of the body of rotation;
a support member for restricting movement of the transducer along the rotational axis and in the circumferential direction, for supporting the transducer to move in a direction toward the rotational axis of the body of rotation, and for enabling rotation of the body of rotation; and
an urging member provided in the support member for urging the transducer toward the rotational axis of the body of rotation so that the transducer is movable in the direction toward the rotational axis of the body of rotation and is usually in contact with the circumference of the body of rotation; and
wherein a contact portion between the transducer and the body of rotation is formed so as to restrict the body of rotation in the axial direction at a predetermined position.

21. The ultrasonic motor according to claim 20, wherein the contact portion of the transducer with the body of rotation is one of a wedge-shaped end and a circular arc-shaped end, and wherein the body of rotation is provided with a recess to be substantially fitted onto an end of the contact portion of the transducer.

22. An ultrasonic motor, comprising:
at least one transducer exciting an elliptical vibration produced by combining a bending standing-wave vibration with a longitudinal vibration;
a body of rotation rotatable about a rotational axis relative to the transducer by the effect of the elliptical vibration of the transducer arranged at a predetermined position along a circumference of the body of rotation;
a support member for restricting movement of the transducer along the rotational axis and in the circumferential direction, for supporting the transducer to move in a direction toward the rotational axis of the body of rotation, and for enabling rotation of the body of rotation; and
an urging member provided in the support member for urging the transducer toward the rotational axis of the body of rotation so that the transducer is movable in the direction toward the rotational axis of the body of rotation and is usually in contact with the circumference of the body of rotation; and
wherein the transducer is rotatably supported about an axis substantially in parallel with the rotational axis of the body of rotation.

* * * * *

UNITED STATES PATENT AND TRADEMARK OFFICE
CERTIFICATE OF CORRECTION

PATENT NO.         : 7,268,464 B2                                                 Page 1 of 1
APPLICATION NO.    : 11/121285
DATED              : September 11, 2007
INVENTOR(S)        : Masanori Kishi It is certified that error appears in the above-identified patent and that said Letters Patent is hereby corrected as shown below:

IN THE SPECIFICATION

At column 3, line 16, before the words "a first", insert --to--.

Signed and Sealed this

Third Day of February, 2009

JOHN DOLL
*Acting Director of the United States Patent and Trademark Office*